(12) United States Patent
Katkar et al.

(10) Patent No.: US 10,475,726 B2
(45) Date of Patent: Nov. 12, 2019

(54) LOW CTE COMPONENT WITH WIRE BOND INTERCONNECTS

(71) Applicant: Invensas Corporation, San Jose, CA (US)

(72) Inventors: Rajesh Katkar, San Jose, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/037,519

(22) Filed: Jul. 17, 2018

(65) Prior Publication Data

US 2018/0366392 A1 Dec. 20, 2018

Related U.S. Application Data

(60) Division of application No. 15/587,930, filed on May 5, 2017, now Pat. No. 10,032,647, which is a
(Continued)

(51) Int. Cl.
*H01L 23/48* (2006.01)
*H01L 21/768* (2006.01)
(Continued)

(52) U.S. Cl.
CPC .......... *H01L 23/481* (2013.01); *H01L 21/481* (2013.01); *H01L 21/486* (2013.01);
(Continued)

(58) Field of Classification Search
CPC . H01L 23/481; H01L 21/481; H01L 21/4853; H01L 21/6835; H01L 21/4889; H01L 21/486; H01L 23/49827
See application file for complete search history.

(56) References Cited

U.S. PATENT DOCUMENTS 3,289,452 A 12/1966 Koellner
3,358,897 A 12/1967 Christensen
(Continued)

FOREIGN PATENT DOCUMENTS

CN 1292635 A 4/2001
CN 1641832 A 7/2005
(Continued)

OTHER PUBLICATIONS

"EE Times Asia" [online]. [Retrieved Aug. 8, 2010]. Retrieved from internet. <http://www.eetasia.com/ART_8800428222_480300_nt_dec52276.HTM>, 4 pages.
(Continued)

*Primary Examiner* — Anthony Ho
(74) *Attorney, Agent, or Firm* — Lerner, David, Littenberg, Krumholz & Mentlik, LLP

(57) ABSTRACT

A component such as an interposer or microelectronic element can be fabricated with a set of vertically extending interconnects of wire bond structure. Such method may include forming a structure having wire bonds extending in an axial direction within one of more openings in an element and each wire bond spaced at least partially apart from a wall of the opening within which it extends, the element consisting essentially of a material having a coefficient of thermal expansion ("CTE") of less than 10 parts per million per degree Celsius ("ppm/° C."). First contacts can then be provided at a first surface of the component and second contacts provided at a second surface of the component facing in a direction opposite from the first surface, the first contacts electrically coupled with the second contacts through the wire bonds.

8 Claims, 8 Drawing Sheets

Related U.S. Application Data continuation of application No. 14/289,860, filed on May 29, 2014, now Pat. No. 9,646,917.

(51) Int. Cl.
  *H01L 23/00*     (2006.01)
  *H01L 23/498*    (2006.01)
  *H01L 21/48*     (2006.01)
  *H01L 21/683*    (2006.01)
  *H01L 23/373*    (2006.01)

(52) U.S. Cl.
  CPC ...... *H01L 21/4853* (2013.01); *H01L 21/4889* (2013.01); *H01L 21/6835* (2013.01); *H01L 21/76898* (2013.01); *H01L 23/49827* (2013.01); *H01L 24/43* (2013.01); *H01L 24/46* (2013.01); *H01L 23/3731* (2013.01); *H01L 23/3738* (2013.01); *H01L 2221/68345* (2013.01); *H01L 2221/68359* (2013.01); *H01L 2224/023* (2013.01); *H01L 2224/4502* (2013.01); *H01L 2924/00014* (2013.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,195,237 A | 3/1993 | Cray et al. |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,454,161 A | 10/1995 | Beilin et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,607,818 A | 3/1997 | Akram et al. |
| 5,608,265 A | 3/1997 | Kitano et al. |
| 5,615,824 A | 4/1997 | Fjelstad et al. |
| 5,629,241 A | 5/1997 | Matloubian et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,839,191 A | 11/1998 | Economy et al. |
| 5,854,507 A | 12/1998 | Miremadi et al. |
| 5,895,967 A | 4/1999 | Stearns et al. |
| 5,896,271 A | 4/1999 | Jensen et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,025,650 A | 2/2000 | Tsuji et al. |
| 6,032,359 A | 3/2000 | Carroll |
| 6,038,136 A | 3/2000 | Weber |
| 6,050,832 A | 4/2000 | Lee et al. |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,083,837 A | 7/2000 | Millet |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Farad et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,252,178 B1 | 6/2001 | Hashemi |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,350,668 B1 | 2/2002 | Chakravorty |
| 6,358,627 B2 | 3/2002 | Benenati et al. |
| 6,362,520 B2 | 3/2002 | DiStefano |
| 6,362,525 B1 | 3/2002 | Rahim |
| 6,373,273 B2 | 4/2002 | Akram et al. |
| 6,376,769 B1 | 4/2002 | Chung |
| 6,388,333 B1 | 5/2002 | Taniguchi et al. |
| 6,407,448 B2 | 6/2002 | Chun |
| 6,413,850 B1 | 7/2002 | Ooroku et al. |
| 6,420,664 B1 | 7/2002 | Muramatsu et al. |

(56) References Cited

U.S. PATENT DOCUMENTS

| | | |
|---|---|---|
| 6,426,642 B1 | 7/2002 | Akram et al. |
| 6,439,450 B1 | 8/2002 | Chapman et al. |
| 6,458,411 B1 | 10/2002 | Goossen et al. |
| 6,459,039 B1 | 10/2002 | Bezama et al. |
| 6,469,393 B2 | 10/2002 | Oya |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,512,552 B1 | 1/2003 | Subramanian |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,528,874 B1 | 3/2003 | Iijima et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,562,660 B1 | 5/2003 | Sakamoto et al. |
| 6,573,458 B1 | 6/2003 | Matsubara et al. |
| 6,578,754 B1 | 6/2003 | Tung |
| 6,581,283 B2 | 6/2003 | Sugiura et al. |
| 6,617,236 B2 | 9/2003 | Oosawa et al. |
| 6,624,653 B1 | 9/2003 | Cram |
| 6,630,730 B2 | 10/2003 | Grigg |
| 6,646,337 B2 | 11/2003 | Iijima et al. |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,753,600 B1 | 6/2004 | Ho |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,778,406 B2 | 8/2004 | Eldridge et al. |
| 6,779,783 B2 | 8/2004 | Kung et al. |
| 6,782,610 B1 | 8/2004 | Iijima et al. |
| 6,790,757 B1 | 9/2004 | Chittipeddi et al. |
| 6,815,257 B2 | 11/2004 | Yoon et al. |
| 6,828,221 B2 | 12/2004 | Iijima et al. |
| 6,828,668 B2 | 12/2004 | Smith et al. |
| 6,844,619 B2 | 1/2005 | Tago |
| 6,855,577 B2 | 2/2005 | Azuma |
| 6,856,235 B2 | 2/2005 | Fjelstad |
| 6,867,499 B1 | 3/2005 | Tabrizi |
| 6,884,709 B2 | 4/2005 | Iijima et al. |
| 6,891,273 B2 | 5/2005 | Pu et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Kluemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,183,650 B2 | 2/2007 | Shiono et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,589,424 B2 | 9/2009 | Muthukumar et al. |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,838,337 B2 | 11/2010 | Marimuthu et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,067,267 B2 | 11/2011 | Raba et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Raba et al. |
| 8,193,604 B2 | 6/2012 | Lin et al. |

(56) References Cited

U.S. PATENT DOCUMENTS

| | | |
|---|---|---|
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,278,752 B2 | 10/2012 | Roberts et al. |
| 8,304,900 B2 | 11/2012 | Jang et al. |
| 8,314,492 B2 | 11/2012 | Egawa |
| 8,319,338 B1 | 11/2012 | Berry et al. |
| 8,476,115 B2 | 7/2013 | Choi et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,835,228 B2 | 9/2014 | Mohammed |
| 8,878,353 B2 | 11/2014 | Haba et al. |
| 8,909,933 B2 | 12/2014 | Pieczul et al. |
| 8,927,337 B2 | 1/2015 | Haba et al. |
| 9,646,917 B2 | 5/2017 | Katkar et al. |
| 2001/0002607 A1 | 6/2001 | Sugiura et al. |
| 2001/0007370 A1 | 7/2001 | Distefano |
| 2001/0019852 A1 | 9/2001 | Hashimoto |
| 2001/0021541 A1 | 9/2001 | Akram et al. |
| 2001/0028114 A1 | 10/2001 | Hosomi |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0151067 A1 | 8/2003 | Iijima et al. |
| 2003/0162378 A1 | 8/2003 | Mikami |
| 2003/0164540 A1 | 9/2003 | Lee et al. |
| 2003/0183947 A1 | 10/2003 | Ohuchi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Kamezos et al. |
| 2004/0124518 A1 | 7/2004 | Kamezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0183167 A1 | 9/2004 | Hortaleza et al. |
| 2004/0188499 A1 | 9/2004 | Nosaka |
| 2004/0238934 A1 | 12/2004 | Warner et al. |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0194180 A1 | 9/2005 | Kirby et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0001179 A1 | 1/2006 | Fukase et al. |
| 2006/0012026 A1 | 1/2006 | Kang et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0205117 A1 | 9/2006 | Grigg et al. |
| 2006/0255449 A1 | 11/2006 | Lee et al. |
| 2006/0278682 A1 | 12/2006 | Lange et al. |
| 2007/0015353 A1 | 1/2007 | Craig et al. |
| 2007/0035033 A1 | 2/2007 | Ozguz et al. |
| 2007/0090524 A1 | 4/2007 | Abbott |
| 2007/0148819 A1 | 6/2007 | Haba et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0003402 A1 | 1/2008 | Haba et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0108178 A1 | 5/2008 | Wilson et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0128886 A1 | 6/2008 | Kang et al. |

(56) References Cited

U.S. PATENT DOCUMENTS

| | | |
|---|---|---|
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0193937 A1 | 8/2010 | Nagamatsu et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0273293 A1 | 10/2010 | Haba et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0062549 A1 | 3/2011 | Lin |
| 2011/0068453 A1 | 3/2011 | Cho et al. |
| 2011/0115081 A1 | 5/2011 | Osumi |
| 2011/0133342 A1 | 6/2011 | Arai |
| 2011/0140259 A1 | 6/2011 | Cho et al. |
| 2011/0147911 A1 | 6/2011 | Kohl et al. |
| 2011/0155433 A1 | 6/2011 | Funaya et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2012/0007232 A1 | 1/2012 | Haba |
| 2012/0015481 A1 | 1/2012 | Kim |
| 2012/0018885 A1 | 1/2012 | Lee et al. |
| 2012/0025365 A1 | 2/2012 | Haba |
| 2012/0043655 A1 | 2/2012 | Khor et al. |
| 2012/0061814 A1 | 3/2012 | Camacho et al. |
| 2012/0063090 A1 | 3/2012 | Hsiao et al. |
| 2012/0086130 A1 | 4/2012 | Sasaki et al. |
| 2012/0104595 A1 | 5/2012 | Haba et al. |
| 2012/0119380 A1 | 5/2012 | Haba |
| 2012/0139082 A1 | 6/2012 | Oganesian et al. |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280386 A1 | 11/2012 | Sato et al. |
| 2012/0313239 A1 | 12/2012 | Zohni |
| 2013/0049221 A1 | 2/2013 | Han et al. |
| 2013/0069222 A1 | 3/2013 | Camacho |
| 2013/0105979 A1 | 5/2013 | Yu et al. |
| 2013/0134588 A1 | 5/2013 | Yu et al. |
| 2013/0313012 A1 | 11/2013 | Yang et al. |
| 2014/0036454 A1 | 2/2014 | Caskey et al. |
| 2014/0070423 A1 | 3/2014 | Woychik et al. |
| 2014/0091473 A1 | 4/2014 | Len et al. |

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1093329 A2 | 4/2001 |
| EP | 1449414 A1 | 8/2004 |
| EP | 2234158 A1 | 9/2010 |
| FR | 2957191 A1 | 9/2011 |
| JP | 59189069 | 10/1984 |
| JP | 61125062 A | 6/1986 |
| JP | 62226307 | 10/1987 |
| JP | 1012769 A | 1/1989 |
| JP | 6471162 | 3/1989 |
| JP | 1118364 | 5/1989 |
| JP | 06268015 A | 9/1994 |
| JP | 07122787 A | 5/1995 |
| JP | 09505439 | 5/1997 |
| JP | 11074295 A | 3/1999 |
| JP | 11135663 A | 5/1999 |
| JP | 11-163207 A | 6/1999 |
| JP | 11251350 A | 9/1999 |
| JP | 2001196407 A | 7/2001 |
| JP | 2001267490 A | 9/2001 |
| JP | 2001326236 A | 11/2001 |
| JP | 2002289769 A | 10/2002 |
| JP | 2003122611 A | 4/2003 |
| JP | 2003174124 A | 6/2003 |
| JP | 2003-309370 A | 10/2003 |
| JP | 2003307897 A | 10/2003 |
| JP | 2004047702 A | 2/2004 |
| JP | 2004281514 A | 10/2004 |
| JP | 2004337856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006032554 A | 2/2006 |
| JP | 2006186086 A | 7/2006 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 20010094893 A | 11/2001 |
| KR | 20010094894 A | 11/2001 |
| KR | 100393102 | 7/2002 |
| KR | 20020058216 A | 7/2002 |

(56) References Cited

FOREIGN PATENT DOCUMENTS

| | | | |
|---|---|---|---|
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| TW | 512467 B | 12/2002 |
| TW | 595296 B | 6/2004 |
| TW | I224382 B | 11/2004 |
| TW | 200512843 A | 4/2005 |
| TW | 200810079 A | 2/2008 |
| TW | 200933760 A | 8/2009 |
| TW | 201023277 A | 6/2010 |
| WO | 0213256 A1 | 2/2002 |
| WO | 2003007370 A1 | 1/2003 |
| WO | 03045123 A1 | 5/2003 |
| WO | 2006050691 A2 | 5/2006 |
| WO | 2008065896 A1 | 6/2008 |
| WO | 2008120755 A1 | 10/2008 |
| WO | 2010101163 A1 | 9/2010 |
| WO | 2012067177 A1 | 5/2012 |

OTHER PUBLICATIONS

"Wafer Level Stack—WDoD", [online]. [Retrieved Aug. 5, 2010]. Retrieved from the internet. <http://www.3d-plus.com/techno-wafer-level-stack-wdod.php>, 2 pages.

Bang, U.S. Appl. No. 10/656,534, filed Sep. 5, 2003.

International Search Report and Written Opinion for Application No. PCT/US2015/033007 dated Aug. 24, 2015.

Jin, Yonggang et al., "STM 3D-IC Package and 3D eWLB Development," STMicroelectronics Singapore/STMicroelectronics France May 21, 2010.

Kim et al., "Application of Through Mold Via (TMV) as PoP base package", 6 pages (2008).

Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).

Neo-Manhattan Technology, A Novel HDI Manufacturing Process, "High-Density Interconnects for Advanced Flex Substrates & 3-D Package Stacking, " IPC Flex & Chips Symposium, Tempe, AZ, Feb. 11-12, 2003.

North Corporation, "Processed Intra-layer Interconnection Material for PWBs [Etched Copper Bump with Copper Foil]," NMBITM, Version 2001.6.

Redistributed Chip Package (RCP) Technology, Freescale Semiconductor, 2005, 6 pages.

Yoon, PhD, Seung Wook, "Next Generation Wafer Level Packaging Solution for 3D integration," May 2010, STATS ChipPAC Ltd.

LOW CTE COMPONENT WITH WIRE BOND INTERCONNECTS

CROSS-REFERENCE TO RELATED APPLICATION

This application is a divisional of U.S. application Ser. No. 15/587,930, filed on May 5, 2017, which is a continuation of U.S. application Ser. No. 14/289,860, filed on May 29, 2014, now U.S. Pat. No. 9,646,917, the disclosures of which are hereby incorporated herein by reference.

BACKGROUND OF THE INVENTION

Field of the Invention

Subject matter described in the present application involves components which have wire bond vias extending in a direction of a thickness of an element having a low coefficient of thermal expansion ("CTE"), e.g., an interposer or microelectronic element, and method of their fabrication. Such component can be assembled with one or more other elements in a microelectronic assembly.

Description of the Related Art

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent to each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate or circuit panel. When the other component is a package substrate in some cases the package substrate may in turn be electrically connected with still another component which may be or may include a circuit panel.

SUMMARY OF THE INVENTION

In accordance with an aspect of the invention, a method is provided for fabricating a component which may be an interposer or other device, e.g., microelectronic element or assembly including an interposer, microelectronic element, or combination thereof. Such method can include forming a structure including a plurality of wire bonds each extending in an axial direction within an opening of one or more openings in an element and each wire bond spaced at least partially apart from a wall of the opening within which it extends, the element consisting essentially of a material having a coefficient of thermal expansion ("CTE") of less than 10 parts per million per degree Celsius ("ppm/° C."). The structure typically has first contacts at a first surface of the component and second contacts at a second surface of the component facing in a direction opposite from the first surface. The first contacts may be first ends of the wire bonds or the first contacts may be coupled to first ends of the wire bonds. The second contacts typically are electrically coupled with the wire bonds.

By forming a low CTE component using wire bonds as vertical interconnects, a thickness of the low CTE component can be increased beyond that which is typically possible using through-silicon via ("TSV") processes. This is because the wire bond interconnect can be formed prior to being assembled within an opening of the low CTE element, eliminating a requirement of TSV processing wherein holes in a low CTE element are filled with a metal by deposition, e.g., plating. With TSV processing, the cost of plating within small holes exponentially increases with the depth of the holes. As a result, semiconductor elements and active chips which have TSVs typically require thinning to a thickness of 100 microns or less to permit forming the TSVs by filling with a deposited metal. This requirement has led the industry into other difficulties, most notably difficulties with handling of thin wafers.

In accordance with embodiments of the invention disclosed herein, the thickness of a low CTE component or interposer taught herein can be much greater than that of a thinned wafer in which TSVs are formed. For example, a low CTE component may be formed from an element or block consisting essentially of low CTE material in which the thickness thereof may be greater than 50 microns, or in one example may be from 0.5 millimeter to two millimeters. In a particular example, the thickness may be about one millimeter. As will be further described herein, thinning of the low CTE component during processing may not be required at all, since wire bonds can be formed which extend in a vertical direction equal to the thickness of the low CTE component.

In addition, incorporation of such low CTE component in a microelectronic assembly can help to address possible warpage problems when thinner low CTE interposers or chips are combined with other elements having higher CTEs. This is due at least in part to a greater thickness, e.g., up to one millimeter, of the low CTE component which is possible using the structure and methods disclosed herein.

In accordance with one or more aspects of the invention, the openings in the element may be uncovered by any portion of the element and may be uncovered by any other element having a CTE of less than 10 ppm/° C.

In accordance with one or more aspects of the invention, the forming the structure includes providing a first element having a plurality of wire bonds extending upwardly away therefrom. The wire bonds may be inserted into one or more openings in the element having the CTE of less than 10 ppm/° C.

In accordance with one or more aspects of the invention, the method may further comprise forming at least one of: a first redistribution layer electrically coupled between the wire bonds and the first contacts, or a second redistribution layer electrically coupled between the wire bonds and the second contacts.

In accordance with one or more aspects of the invention, forming the structure may further include forming the wire bonds such that first ends of the wire bonds are formed on metallic elements of a first redistribution layer, and then inserting each wire bond into an opening of the one or more openings.

In accordance with one or more aspects of the invention, forming the structure may include inserting individual wire bonds of the plurality of wire bonds into respective openings in the element, such that each wire bond may be separated from each other wire bond by material of the element.

In accordance with one or more aspects of the invention, the openings may be blind openings when the individual wire bonds may be inserted therein, and the method further comprises reducing a thickness of the element after the inserting to provide access to ends of the wire bonds.

In accordance with one or more aspects of the invention, the inserting may comprise inserting some of the plurality of the wire bonds into a same opening of the plurality of openings.

In accordance with one or more aspects of the invention, an electrically insulative material may be provided within the openings in contact with the wire bonds.

In accordance with one or more aspects of the invention, the element may include a plurality of active devices, at least some of the first or the second contacts being electrically coupled with the plurality of active devices.

In accordance with one or more aspects of the invention, the element may include a monocrystalline semiconductor region, and at least some of the active devices may be disposed at least partially within the monocrystalline semiconductor region, the openings extending at least partially through the monocrystalline semiconductor region.

In accordance with an aspect of the invention, a component is provided which comprises a plurality of wire bonds each extending in an axial direction within an opening of one or more openings in an element having a coefficient of thermal expansion ("CTE") of less than 10 parts per million per degree Celsius ("ppm/° C."). Each wire bond can be spaced at least partially away from a wall of the opening within which it extends. The component can further comprises first contacts at a first surface of the component and second contacts at a second surface of the component facing in a direction opposite from the first surface. The first contacts may be first ends of the wire bonds or the first contacts may be coupled to first ends of the wire bonds. The second contacts may be electrically coupled with the wire bonds.

In accordance with one or more aspects of the invention, at least one of: the first contacts or the second contacts may be electrically coupled with the wire bonds through a redistribution layer overlying the wire bonds and overlying a surface of the element defining a plane transverse to the axial direction of the openings. In a particular example, individual wire bonds of the plurality of wire bonds may be disposed within respective openings in the element, such that each wire bond may be separated from each other wire bond by material of the element. In one example, some of the plurality of the wire bonds may be disposed within a same opening of the plurality of openings. In a particular example, an opening may not have a wire bond disposed therein. In one example, an electrically insulative material can be within the openings in contact with the wire bonds. In one example, the electrically insulative material may touch or surround only portions of the wire bonds adjacent the first ends of the wire bonds, or only portions of the wire bonds adjacent the second ends of the wire bonds which are opposite the first ends, or may touch or surround only the first and the second ends of the wire bonds.

In accordance with one or more aspects of the invention, the element may include a plurality of active devices, wherein the first and second contacts may be electrically coupled with one another and with at least some of the plurality of active devices.

In accordance with one or more aspects of the invention, the element may include a monocrystalline semiconductor region, at least some of the active devices being disposed at least partially within the monocrystalline semiconductor region, and the openings extending at least partially through the monocrystalline semiconductor region.

In accordance with one or more aspects of the invention, the first contacts and the second contacts may be within an axial distance of less than 50 microns from the wire bonds.

In accordance with one or more aspects of the invention, the wire bonds may extend only partially through a thickness of the element, and the component may further comprise electrically conductive connectors extending in an axial direction from the wire bonds at least partially through a remaining portion of the thickness of the element, the connectors formed of deposited electrically conductive material.

In accordance with one or more aspects of the invention, at least one of: the first contacts or the second contacts may be not electrically coupled with the wire bonds through a redistribution layer overlying the wire bonds and a surface of the element defining a plane transverse to the axial direction of the openings.

In accordance with one or more aspects of the invention, the wire bonds may comprise wires having different diameters and the diameter of one wire bond may be larger than the diameter of the other wire bonds in one example, by at least 3%, or in another example, by at least 10%.

In accordance with one or more aspects of the invention, the length of at least one wire bond may be shorter than the length of other wire bonds by less than 20% of the length of the other wire bonds.

In accordance with one or more aspects of the invention, individual wire bonds of the plurality of wire bonds may be disposed within respective openings in the element, such that at least one or more of the wire bonds may be not separated from each other wire bond by material of the element.

In accordance with one or more aspects of the invention, individual wire bonds of the plurality of wire bonds may be disposed within respective openings in the element. In some embodiments, one or more of the openings in the element may not contain a wire bond.

In accordance with one or more aspects of the invention, individual wire bonds of the plurality of wire bonds may be disposed within respective openings in the element, and at least one or more openings in the element comprise dielectric material.

DETAILED DESCRIPTION

Components, e.g., interposers, microelectronic elements, and microelectronic assemblies which include such components are described herein which comprise an element made of material having a coefficient of thermal expansion of less than 10 parts per million per degree Celsius ("low CTE material"), typically being a solid monolithic block of semiconductor material such as silicon, a III-V semiconductor compound such as GaAs, InP, etc., or a dielectric material such as a glass, quartz, alumina (e.g., Al2O3) or other ceramic material, among others. A plurality of wire bond interconnects extend in an axial direction within one or more openings which extend through the thickness of the low CTE element. Components having low CTE can be utilized advantageously in applications where differential thermal expansion ordinarily would be a concern when a low CTE component is assembled in close proximity with another component having relatively high CTE and subjected to high thermal stress.

In such components, first contacts at the first surface of the component are interconnected with second contacts at the second surface of the component by wire bonds. Use of wire bonds as vertical interconnects extending through the thickness of the element may in some cases lead to reductions in fabrication costs and tooling costs. Wire bonds can be made to project to substantial distances of tens to hundreds of microns or more above a surface of underlying structure to which they are bonded, and hence can be made to provide vertical interconnects through relatively deep openings in an element. As a result, the use of such wire bond vertical interconnects can help avoid costs associated with thinning and handling of thinned elements such as thinned semiconductor wafers, among others, and use of such wire bond vertical interconnects can help avoid costs associated with forming and filling of high aspect ratio openings with deposited metal to form the vertical interconnects.

Each wire bond interconnect has no more than one end bonded to an underlying metal surface at a location proximate the first surface, and another end of each wire bond remote from such end unbonded and proximate the second surface.

Figure 1A:
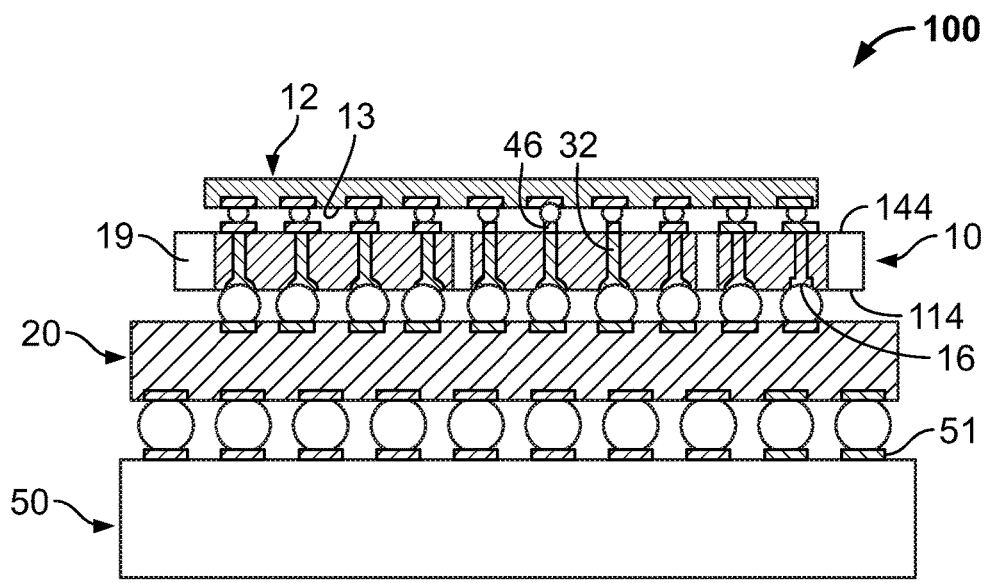
FIG. 1A is a sectional view of a component such as an interposer in accordance with an embodiment of the invention, as interconnected within a microelectronic assembly.

By way of context, FIG. 1A illustrates a microelectronic component 10 such as may be constructed in accordance with an embodiment described herein, as further assembled in a microelectronic assembly 100 with other components as well. In the description and figures which follow, the same numerical references are used to indicate the same features and similar numeric references are used to indicate similar features. As seen in FIG. 1A, first and second contacts 46, 16 are provided at first and second opposite surfaces of the component 10, respectively. Contacts 46, 16 may in turn be electrically connected with corresponding contacts of first and second components of the microelectronic assembly which face those contacts 46, 16. Components described herein such as interposers, substrates, circuit panels, microelectronic elements, and the like typically have dielectric structure at external surfaces thereof. Accordingly, as used in this disclosure, a statement that an electrically conductive element is "at" a surface of dielectric structure of a component, indicates that, when the component is not assembled with any other element, the electrically conductive element is available for contact with a theoretical point moving in a direction perpendicular to the surface of the component toward the surface of the component from outside the component. Thus, a terminal, a contact, or other conductive element which is at a surface of a component may project from such surface; may be flush with such surface; or may be recessed relative to such surface in a hole or depression in the component.

As shown in FIG. 1A, component 10, e.g., an interposer, having a low CTE element 19 may be electrically connected with a first component 12 having active circuit elements thereon, such as a microelectronic element, e.g., a packaged or unpackaged semiconductor die which has a face 13 facing towards the first surface 144 of the component 10 and be packaged or unpackaged as connected to the first contacts 46 of the interposer. As further shown in FIG. 1A, the second contacts 16 of the interposer can be electrically connected with corresponding contacts of another component of the assembly which face the contacts 16, such as contacts of a package substrate 20 in the example illustrated in FIG. 1A. The first and second contacts 46, 16 can be electrically coupled through wire bonds 32 which function as vertical interconnects extending in a direction of a thickness of a low CTE element 19 of the component 10 each wire bond extending within an opening of one or more openings in the low CTE element 19. As used herein, a direction of the thickness of element 19 is defined as an axial direction of the component 10 and a distance in the axial direction is an axial distance. In one example, a thickness of the low CTE element 19 in the axial direction can be greater than 50 microns. In a particular example, the thickness may be between 50 microns and 1 millimeter. In a particular example, the thickness may be within a range from 0.5 millimeter to 2 millimeters.

In some cases, the first contacts or the second contacts, or both the first contacts and second contacts can be ends of the wire bonds. In some cases the ends of the wire bonds may be ball bonds which at least partially remain after the fabrication process. In some cases, the ends of some of the wire bonds 32 may be contacts or may be mechanically coupled to such contacts, but such wire bonds may not all be electrically coupled with another component through contacts 46 at the first surface 144 and contacts 16 at the second surface. In a particular embodiment, there may be only one wire bond in component 10.

As may be assembled with other components in assembly 100, component 10 may be an interposer for electrically coupling a first component above the interposer, such as, for example, a microelectronic element 12, with a second component such as package substrate 20. As an alternative to the arrangement shown in FIG. 1A or in addition thereto, some or all of the second contacts 16 may be connected with a second unpackaged or packaged semiconductor die having a surface facing the second surface 114 of the component. Package substrate 20 or other component interconnected with the component 10 can, in turn be mounted to contacts 51 of a circuit panel 50, as shown in FIG. 1A. Alternatively, in some cases the package substrate 20 may be omitted from microelectronic assembly 100 and the contacts 16 of the component 10 can be electrically coupled with corresponding contacts 51 of a circuit panel 50.

In one example, an area and edges of the component 10 can be aligned with those of the microelectronic element 12 such that the surface 114 occupies an area which is a projection of an area of a surface 13 of the microelectronic element thereon. In such example, the component 10 and the microelectronic element 12 joined thereto can form a "chip-scale package" or "CSP".

Figure 1B:
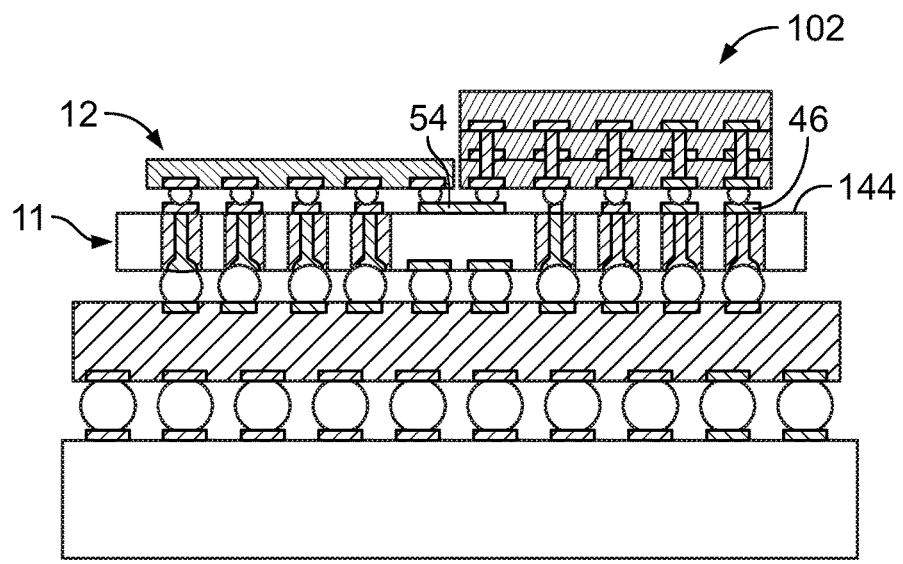
FIG. 1B is a sectional view of an alternative component such as an interposer in accordance with an embodiment of the invention, as interconnected within a microelectronic assembly.

FIG. 1B illustrates a microelectronic assembly 102 according to a further example in which first and second microelectronic elements 12, 52 can be electrically interconnected with a component 11 through first contacts 46 at a first surface 144 of the component 11. The microelectronic elements, which may be packaged or unpackaged semiconductor dies, may be electrically interconnected with one another through conductive structure provided on the component 11, such as traces 54 thereon, which may extend in a direction parallel to a first surface 114 of the component.

Figure 2A:
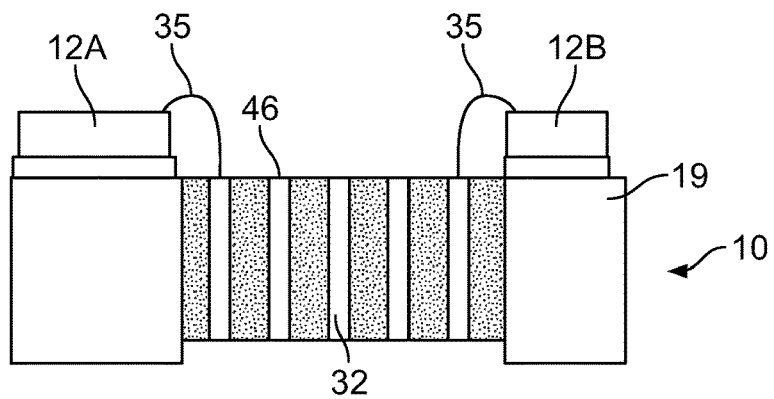
FIG. 2A is a sectional view of a component such as an interposer in accordance with a variation of an embodiment seen in FIG. 1A or 1B, as interconnected within a microelectronic assembly.
Figure 2B:
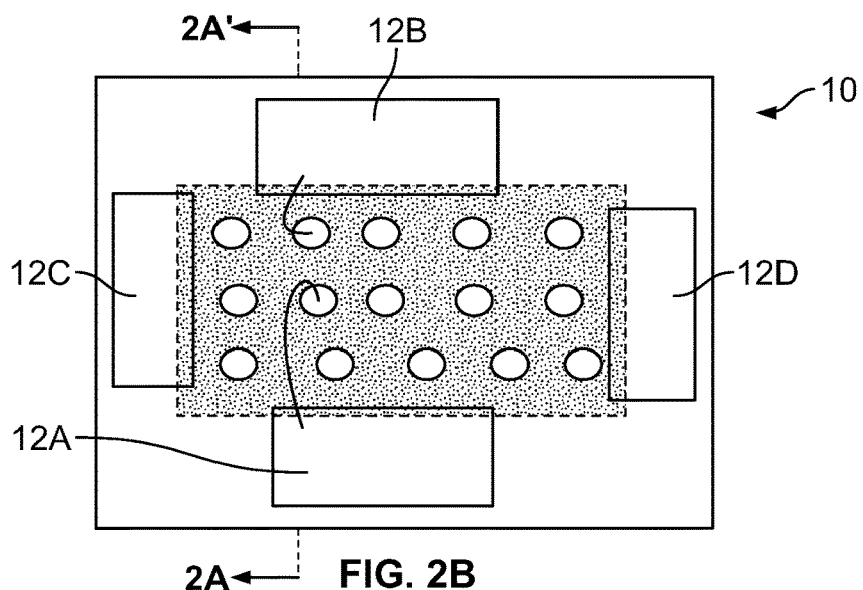
FIG. 2B is a corresponding plan view of a component such as an interposer within a microelectronic assembly.

FIGS. 2A-2B illustrate an alternative manner in which microelectronic elements 12A, 12B may be electrically coupled with a component 10 such as an interposer. As seen therein, the microelectronic elements 12A, 12B are coupled via wire bonds 35 with the contacts 46 at an upper surface of the interposer. The contacts 46 may in some cases be ends of the wire bonds 32 which extend in the axial direction of the low CTE element of the component. Alternatively, a redistribution structure can be disposed between ends of the wire bonds 32 and contacts 46, or between ends of the wire bonds 32 and contacts 16, or between both ends of the wire bonds and the contacts 46 and 16. As further seen in FIG. 2B, additional microelectronic elements 12C and 12D may be disposed atop the interposer, some or all of which can be electrically coupled with electrically conductive elements of the interposer.

Figure 2C:
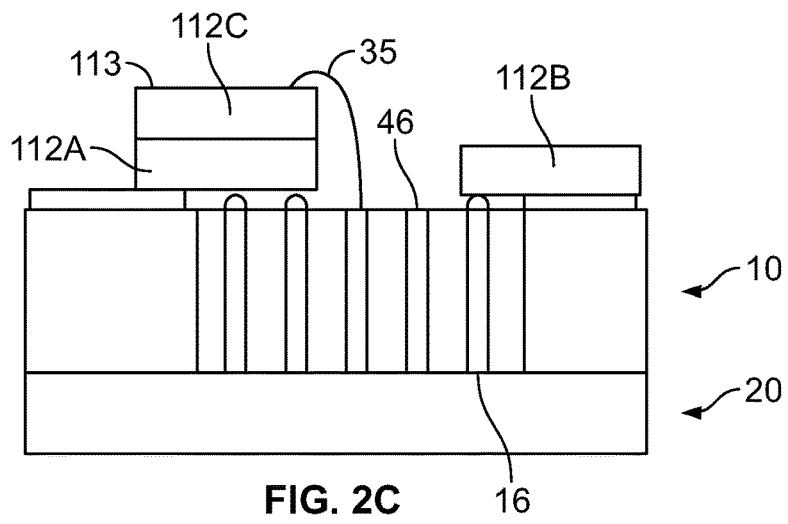
FIG. 2C is a sectional view of an interposer as interconnected within a microelectronic assembly in accordance with a further variation of an embodiment seen in FIGS. 2A and 2B.

FIG. 2C illustrates a further variation in which microelectronic elements 112A and 112B have contact-bearing faces which face an upper surface of the component 10. In this case, at least some contacts of the microelectronic elements 112A and 112B face corresponding contacts 46 of the component 10 and are electrically coupled therewith by flip-chip bonds, e.g., without limitation, bonds that may include an electrically conductive material or diffusion bond coupling the contacts of the microelectronic elements 112A and 112B with the corresponding contacts 46 juxtaposed therewith. FIG. 2C further illustrates an additional microelectronic element 112C which may be electrically coupled with the component 10, such as in a face-up configuration with one or more wire bonds 35 coupled to contacts on the upwardly-facing surface 113 of the microelectronic element 112C and one or more contacts 46 of component 10. FIG. 2C further illustrates an assembly further including a substrate 20 electrically coupled with contacts 16 at a lower surface of component 10.

Figure 3:
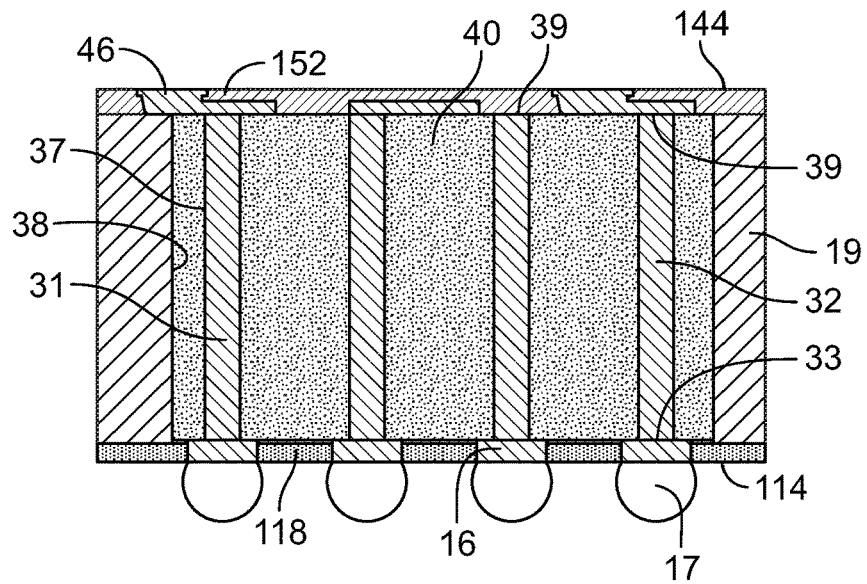
FIG. 3 is a sectional view of component in accordance with an embodiment of the invention.

Referring to FIG. 3, a partial sectional view is shown further illustrating a component 10 such as shown and described above with reference to FIG. 1 or FIG. 2. As seen therein, a plurality of wire bonds 32 extend as vertical interconnects through at least one opening 38 extending through a thickness of a low CTE element 19. Low CTE element typically may comprise a solid monolithic element consisting essentially of low CTE material through which opening 38 extends. In particular examples, the low CTE element may consist essentially of semiconductor material, e.g., silicon, germanium, a III-V semiconductor compound, or a solid block of dielectric material such as glass, quartz, or ceramic material (such as, for example, Al2O3), among others. Optionally, as will be described further below, a dielectric material 40 may be disposed within opening 38 and may contact edge surfaces 37 of individual ones of the wire bonds 32. In the example seen in FIG. 3, the dielectric material 40 may fill the opening; however, in other embodiments provided herein, some portion or all of the edge surface 37 of a particular wire bond or each wire bond may not be contacted by a dielectric material. An electrically conductive redistribution layer which may be insulated and/or supported by a dielectric layer 118 may electrically couple first ends 33 of wire bonds 32 with contacts 16. A redistribution layer which may be insulated and/or supported by dielectric layer 152 may electrically couple second ends 39 of wire bonds with contacts 46. In one example, the redistribution layer may be formed in accordance with processing typically used to form a redistribution layer on a surface of an existing component such as an interposer or semiconductor chip, wherein "layer" may mean a structure typically formed by "post-fab" processing after forming a wafer including semiconductor chips having active devices thereon in a "fab", the structure including one or more layers of dielectric material and one or more metal layers which can extend parallel to a surface thereof. In a particular example, a plurality of the metal layers may be interconnected with one another by interconnects extending in a vertical direction extending through a thickness of at least one of the metal layers. In another example, the redistribution layer can be a "back end of line" or "BEOL" structure formed by fabrication methods typically utilized in a "fab". In yet another example, the redistribution layer can include a BEOL structure and a post-fab portion formed thereon or electrically coupled therewith. Joining elements 17, e.g., solder balls or other masses of bonding metal or electrically conductive material can be attached or formed on contacts 16. Similar masses or solder balls can be attached or formed on contacts 46.

In particular embodiments, the wire bonds 32 can be made of copper, gold or aluminum, and may in certain cases have a finish layer of a different metal exposed at an exterior surface of the wire bonds. The diameter of each wire bond may illustratively be between 1 and 500 micrometers ("microns") in diameter. The minimum pitch of adjacent wires in the in-process element may range from a minimum of around twice the smallest diameter of the wire, to a number which may be an even smaller multiple of the wire diameter when the wire diameter is relatively large. In one example, the first and second contacts 46, 16 may be within an axial distance of less than 50 micrometers ("microns") from the wire bonds 32 to which they are electrically coupled.

Figure 4:
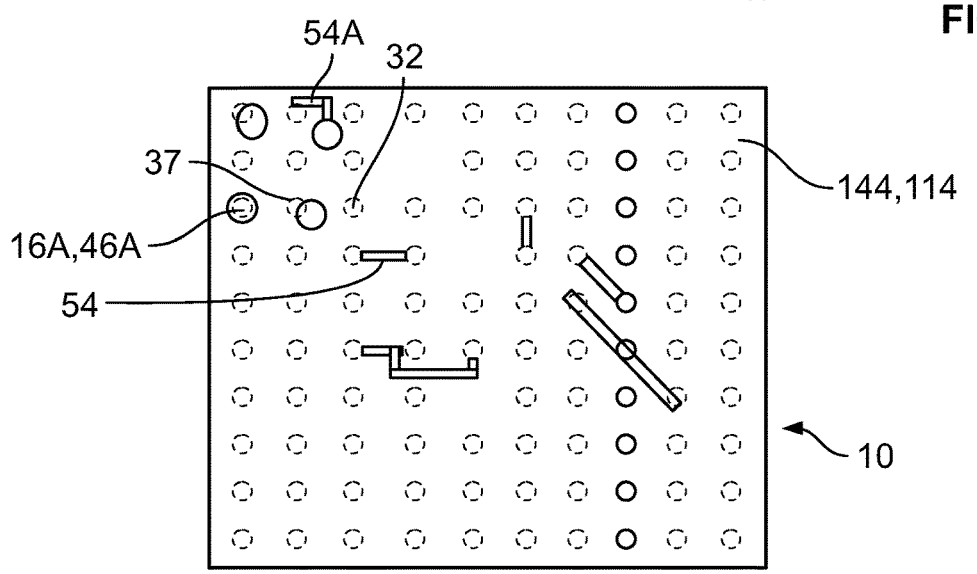
FIG. 4 is a plan view of an interposer in accordance with an embodiment of the invention.
Figure 5:
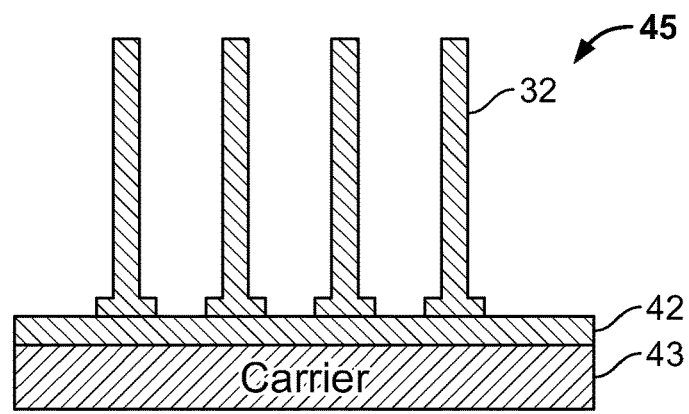
FIG. 5 is a sectional view of an in-process element for incorporation in a component in a fabrication method according to an embodiment of the invention.

FIG. 4 is a corresponding plan view looking toward either a top surface 144 or, alternatively, a bottom surface 114 of the component 10. As seen in FIGS. 3 and 4, the first and second contacts 46, 16 can be made to extend in a lateral direction parallel to the top or bottom surfaces 144,114 beyond an edge surface 37 of the respective wire bond 32, as seen in the case of contacts 46A and 16A. Fabrication of component 10 can be as further described below. Referring now to FIG. 5, a method of fabricating a component 10 such as an interposer will now be described. As seen in FIG. 5, an in-process element 45 can include an array of unterminated wire bonds 32 are formed extending upwardly from one or more metal surfaces to which the wire bonds are joined. This wire bond array may be formed by forming wire bonds by bonding metal wire to one or more surfaces at different locations thereof, which may be locations of an array, and which may be one or more metal surfaces or a surface of a metal sheet below the wire bonds. In one example, the wire bonds 32 can be formed by bonding wires to one or more surfaces such as surfaces of contacts, or to a surface of a metal sheet 42. In an example such as shown in FIG. 5, the metal sheet 42 need not provide full mechanical support for itself or for the wire bonds 32, as that function may be performed by a supporting carrier 43 which may be releasably attached or clamped to the sheet. In a particular example, a bonding tool can bond the metal wire to an exposed surface of a layered structure which includes an unpatterned or patterned metal sheet, and which may include one or more finish metal layers thereon. Thus, in one example, wire bonds can be formed on a base having a metal layer of aluminum, copper or alloy thereof or the like, and the finish layers in one example, may include an "ENIG" finish, such as a layer of nickel deposited on the base metal by electroless deposition, followed by a layer of gold deposited on the nickel layer by an immersion process. In another example, the base metal layer can have an "ENEPIG" finish, such as may be a combination of a layer of electrolessly deposited nickel deposited on the base metal, followed by a layer of electrolessly deposited palladium deposited thereon, and followed by a layer of gold deposited on the palladium by an immersion process.

Wire bonds can be formed by bonding a metal wire to a surface by a technique as previously described in one or more of the aforementioned commonly owned and incorporated United States Applications. In one example, wire bonds can be formed by ball bonding a metal wire to the surface, such as by heating the wire at a tip thereof to form a ball of molten metal and contacting the surface with the ball to form the ball bond so as to form a bulbous portion of the wire as a first end 33 or base of the wire bond, as shown in FIG. 3 for example. In such example, the base of the wire bond may have a shape similar to a ball or a portion of a ball when the base is formed by ball bonding. A wire bond having a base formed by ball bonding may have a shape and may be formed as described, for example, in U.S. patent application Ser. No. 13/462,158, the disclosure of which is incorporated by reference herein. Alternatively, a wire bond may be formed by other techniques such as stitch bonding or wedge bonding in which a portion of the edge surface of a wire is bonded to a surface and may have a shape generally as seen for example, in U.S. patent application Ser. Nos. 13/404,408; 13,404,458; 13/405,125, the disclosures of which are incorporated by reference herein. In such arrangements, the base 33 may have a somewhat flattened cylindrical shape which may extend at a substantial angle (e.g., 15 to 90 degrees) away from the shaft. An upwardly extending shaft portion 31 (FIG. 3) of the wire bond need not extend vertically relative to the bonded base 33, but rather can extend at a substantial angle therefrom (e.g., 15 to 90 degrees). Particular examples of the wire bonds formed this way can be as described in these incorporated applications.

Figure 6:
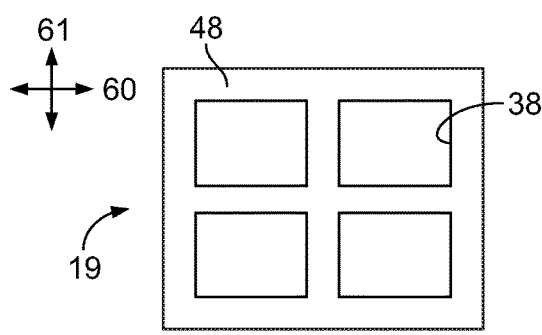
FIG. 6 is a plan view and FIG. 7 a corresponding sectional view of a low CTE element for incorporation in a component in a fabrication method according to an embodiment of the invention.
Figure 7:
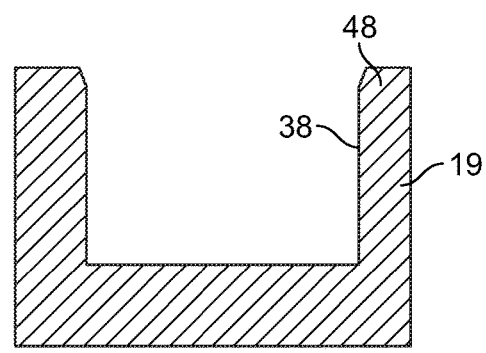
FIGS. 7, 8, 9, 10 and 11 are sectional views illustrating stages in a method of fabricating a component as seen in FIG. 3 in accordance with an embodiment of the invention.

FIGS. 6 and 7 are a plan view and a cross-sectional view, respectively, of a low CTE element 19 as described above having a plurality of openings 38 therein, with portions 48 of the low CTE element 19 between adjacent openings extending to a greater thickness. The openings can be as yet blind openings in that each opening may not extend entirely through a thickness of the low CTE element as seen in FIG. 7. Openings 38 typically are formed by optical or mechanical ablation such as by laser, mechanical milling, dry and wet etching methods. In the example seen in FIGS. 6 and 7, each opening may be sized to accommodate a plurality of adjacent wire bonds which may extend in a row in a first direction 60, and in some cases, may also extend in a column in a second direction 61 transverse to the first direction. Accordingly, each opening 38 may have a size which extends in one or more of the first and second directions 60, 61 for dimensions in each direction of tens of microns to hundreds of microns.

Figure 8:
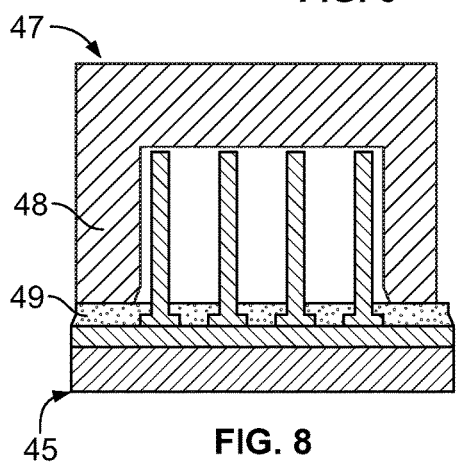

In the stage of processing seen in FIG. 8, the in-process element 45 of FIG. 5 is united with low CTE element 19 of FIGS. 6-7 to form in-process element 47. For example, low CTE element 19 is inverted relative to the orientation shown in FIG. 7 and then united with the in-process element 45. In one embodiment, an adhesive 49 can be provided atop bases of wire bonds 32, the adhesive bonding the portions 48 of the low CTE element 19 between the openings. In a particular example, the low CTE element 19 may be placed in close proximity to or atop the in-process element 45 and then an underfill can be made to flow horizontally into a gap between the in-process element 45 and the low CTE element to form the structure shown in FIG. 8. Alternatively, the adhesive 49 can be a punched adhesive film or a patterned dispensed adhesive that bonds the portions 48 of the low CTE element 19 with the top surface of a metal sheet such as the metal sheet 42 of in-process element 45 shown in FIG. 5. As seen in FIG. 8, the adhesive 49 may touch or flow to the wire bonds 32. Alternatively, the adhesive 49 may not touch or flow to the wire bonds 32.

Figure 9:
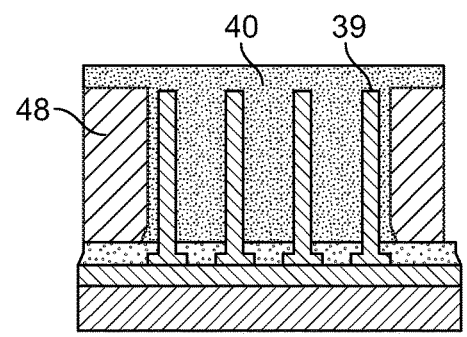

Thereafter, as seen in FIG. 9, the low CTE element can be thinned from the top, such as, for example, by abrasive, milling chemical, polishing or ion process, or combination thereof, until the openings are exposed at the top. In one example, grinding, lapping or polishing can be used to thin the low CTE element. In another example, etching such as a reactive ion etching or plasma etching process can be used. In one example, grinding, lapping or polishing can be used for coarse thinning of the low CTE element, which can be followed by selective reactive ion etching of the dielectric fill 40 to cause ends 39 of the wire bonds 32 to project above surfaces of the portions 48 of the low CTE element between the openings 38.

The openings can then be filled with a suitable dielectric material 40. The dielectric material can be selected so as not to interfere with operation of the component 10 which in some cases may need to be used in an environment which undergoes rapid or extreme temperature fluctuations. Therefore, it may be beneficial in some cases to provide a low CTE dielectric material 40 within the openings which may have a relatively low CTE (e.g., having a CTE of less than 12 ppm/° C., or which may be the same or close to that of low CTE element. Low CTE materials tend to be quite stiff in that their Young's modulus (a measure of elasticity) tends to be much higher than polymeric materials; therefore, finding a filler material which has a CTE relatively close to that of the low CTE element may be needed when this approach is used. Accordingly, for this purpose, molten glass is one possible low CTE filler material which can be used as the filler dielectric material 40. Alternatively, openings can be filled with a material having a relatively high CTE, but which can be a compliant material such as a polymeric material, such material having a low Young's modulus. In some embodiments the dielectric fill 40 may comprise a porous polymer, for example, porous polyimide. In some embodiments, the dielectric material 40 may comprise may comprise more than one type of dielectric material. For example, the majority of the dielectric may be a layer of porous polyimide or other dielectric material and such layer can be capped with an oxide, which in one example may be an oxide deposited from a tetraethyl orthosilicate (TEOS) precursor. The TEOS layer may comprise the RDL over ends 39 of the wire bonds surface 39.

Figure 10:
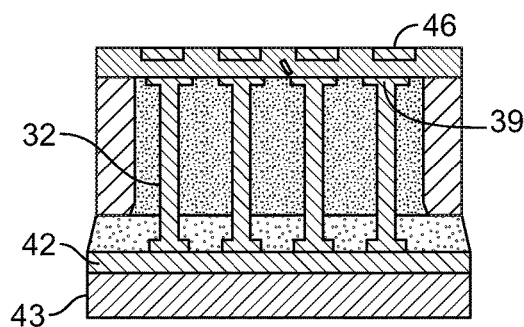
Figure 11:
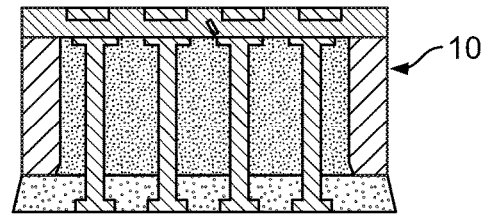

Next, as further seen in FIG. 10, the portion of the filler dielectric material extending above the portions 48 of the low CTE element is removed and ends 39 of the wire bonds can be exposed by a reveal process. A redistribution layer or back end of line ("BEOL") interconnect layer can be formed atop the ends 39 of the wire bonds 32, wherein contacts 46 and optionally traces of the redistribution layer can be provided. The carrier 43 can then be removed and metal sheet 42, if present, can be removed, resulting in the component 10 such as seen in FIG. 11, for example, or as shown and described above with reference to FIG. 3. In some embodiments, the metal sheet may be patterned to fabricate a redistribution layer or to form electrical contacts such as first contacts 46 or second contacts 16.

Figure 12:
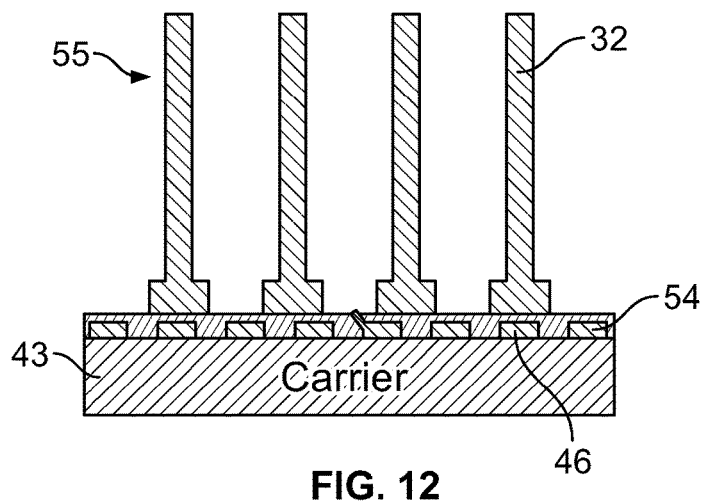
FIGS. 12, 13, 14, and 15 are sectional views illustrating stages in a method of fabricating a component according to a variation of an embodiment of the invention.

FIG. 12 illustrates a stage of fabrication in accordance with a variation of the embodiment described above relative to FIGS. 5-11. In this case, an in-process element 55 may comprise wire bonds 32 formed atop a redistribution layer or BEOL having traces 54 and contacts 46 pre-formed therein, the redistribution layer disposed atop carrier 43. In some embodiments the carrier 43 may comprise a chip, a package or unpackaged device. In some embodiments, the wire bonds 32 may comprise wires of different diameters. In such example, the diameters of one or more wires may be bigger than the diameters of other wires by at least 3%. Also, the diameters of one or more wires may be bigger than the diameters of other wires by at least 10%.

Figure 13:
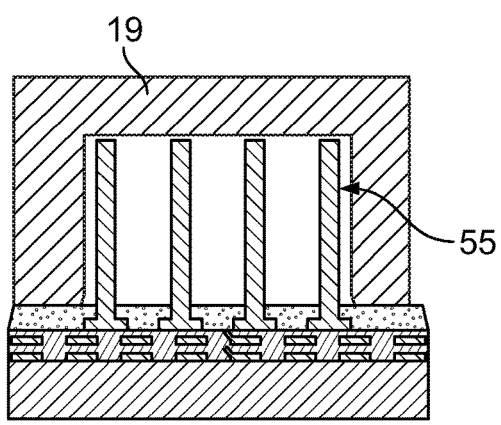
Figure 14:
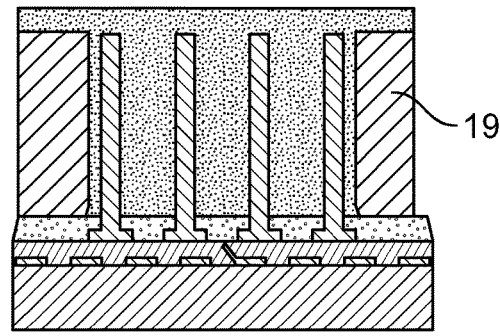
Figure 15:
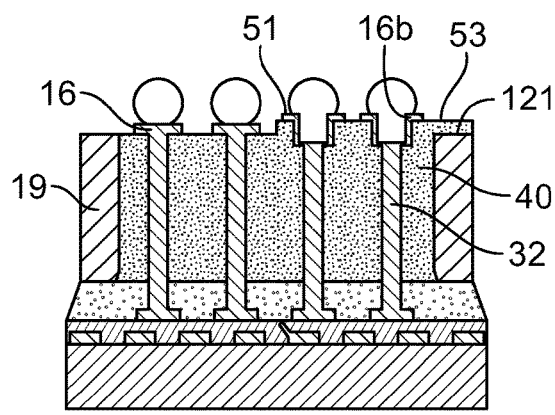

FIG. 12 illustrates a stage of fabrication in accordance with a variation of the embodiment described above relative to FIGS. 5-11. In this case, an in-process element 55 may comprise wire bonds 32 formed atop a redistribution layer having traces 54 and contacts 46 pre-formed therein, the redistribution layer disposed atop carrier 43. FIGS. 13-14 illustrate stages of fabrication in which the in-process element 55 is united with low CTE element 19, and a dielectric material is added thereto, in like manner to that described above relative to FIGS. 8 and 9. FIG. 15 illustrates a further stage of processing in which contacts 16 or 16B can be formed in electrical communication with the wire bonds 32. For example, contacts 16 can be formed atop the dielectric fill 40 and contacts 16B can be formed in depressions extending from a surface 53 of the dielectric fill to the wire bonds 32. In one example, the dielectric fill 40 may extend to a height above a height of the surface 121 of the low CTE element 19, for example, when contacts are formed in a manner as shown in 16B. Alternatively, the top surface of the dielectric fill 40 can be aligned with the surface 121 of low CTE element 19. In some embodiments one or more wire bonds 32 are shorter than the other. For example one or more wire bonds are shorter than other wire bonds by less than 20% of the length of the other wire bonds. In some applications one or more wire bonds are shorter than other wire bonds by more than 10% of the length of the other wire bonds.

Figure 16:
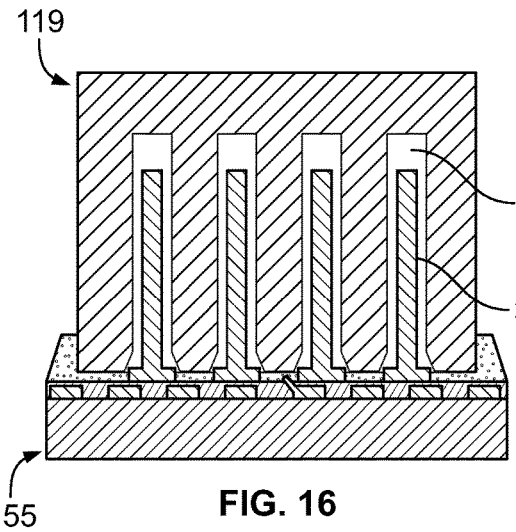
FIGS. 16, 17 and 18 are sectional views illustrating stages in a method of fabricating a component according to a variation of an embodiment of the invention.
Figure 17:
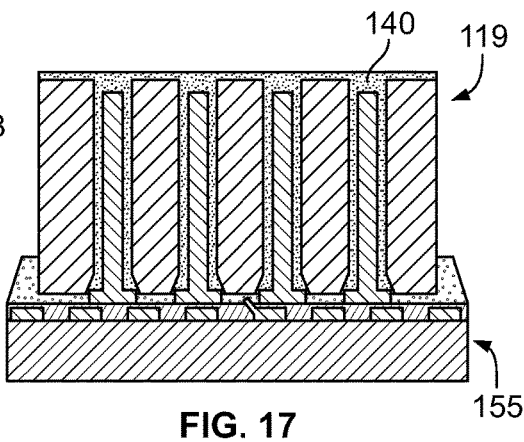
Figure 18:
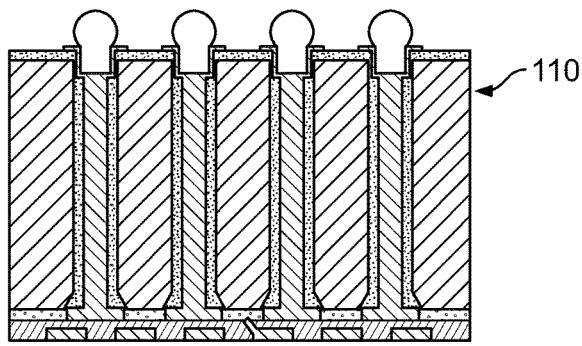

FIGS. 16-18 illustrate a variation of the above embodiment described relative to FIGS. 3-11, in which each opening 138 in a low CTE element 119 is sized to accommodate a single wire bond. For example, a cylindrical shaft of each wire bond 32 of in-process element 155 can extend vertically within a single opening 138 in the low CTE element. When the low CTE element is made of semiconductor material, each opening 138 can be lined with a dielectric material (not shown) before uniting the in-process element therewith. For example, such dielectric liner can be deposited or formed thereon by a number of possible processes which may include chemical vapor deposition, local oxidation or nitridation, among others. FIGS. 17 and 18 illustrate stages in a process of fabrication which are analogous to those shown in FIGS. 13 and 14, wherein a dielectric fill can be formed in the openings 138 after the low CTE element has been united with the in-process element 155. FIG. 18 further illustrates an exemplary component 110, e.g., interposer, formed in this manner. In some embodiments (not shown), one or more of openings 138 may not contain a wire bond. In such embodiment, an opening 138 which lacks a wire bond therein may contain dielectric material. Such opening 138 may be partially or completely filled with a dielectric material.

In a variation of the above-described processing, an uncured dielectric material 140, e.g., a liquid material may be present in openings 138 prior to the wire bonds 32 being inserted therein. In such manner, the deposition or filling of a dielectric material after thinning the low CTE element 119 may be avoided or may be further facilitated or aided thereby.

In another variation, the openings may not be filled with a dielectric material, but instead the axial dimension of each opening can be allowed to remain either partially or substantially completely unfilled by a dielectric material. For example, only the top and bottom ends of each opening may be plugged. In such case, air or a void remaining within each opening in the final component can serve as a dielectric having an even lower permittivity than a solid polymeric or inorganic dielectric material that may otherwise be used.

Figure 19:
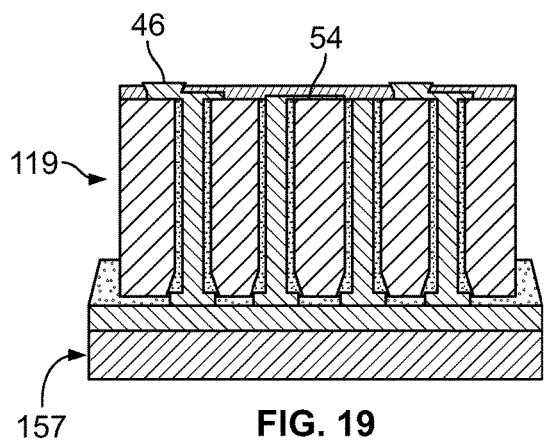
FIGS. 19 and 20 are sectional views illustrating stages in a method of fabricating a component according to a variation of the embodiment illustrated in FIGS. 16, 17 and 18.
Figure 20:
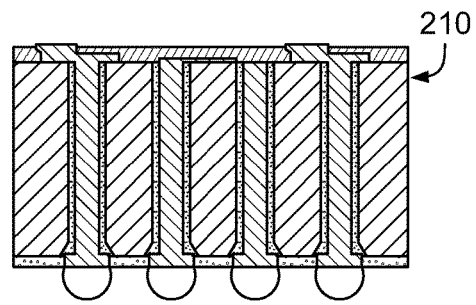

FIGS. 19 and 20 illustrate a further variation in which a redistribution layer comprising traces 54 and contacts 46 can be formed atop the wire bonds 32 after the low CTE element 119 and a corresponding in-process element 157 are united. A completed component 210 such as an interposer is illustrated in FIG. 20.

Figure 21:
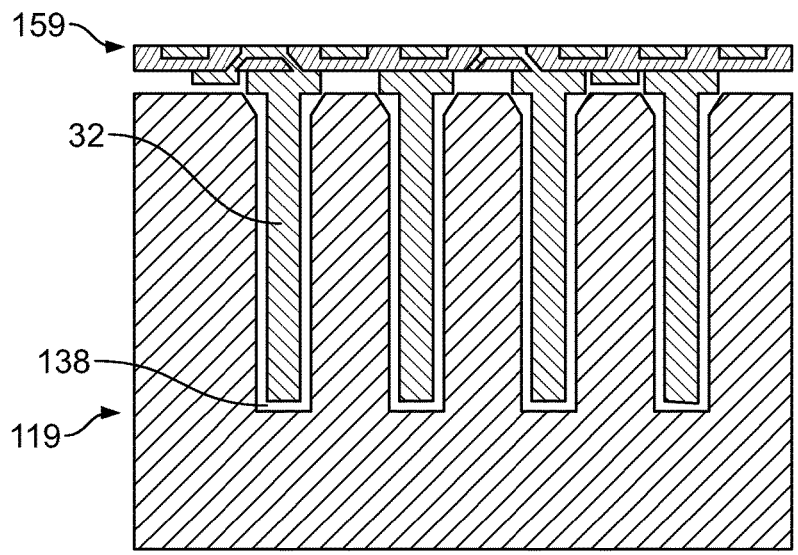
FIGS. 21, 22 and 23 are sectional views illustrating stages in a method of fabricating a component according to a variation of the embodiment illustrated in FIGS. 16, 17 and 18.
Figure 22:
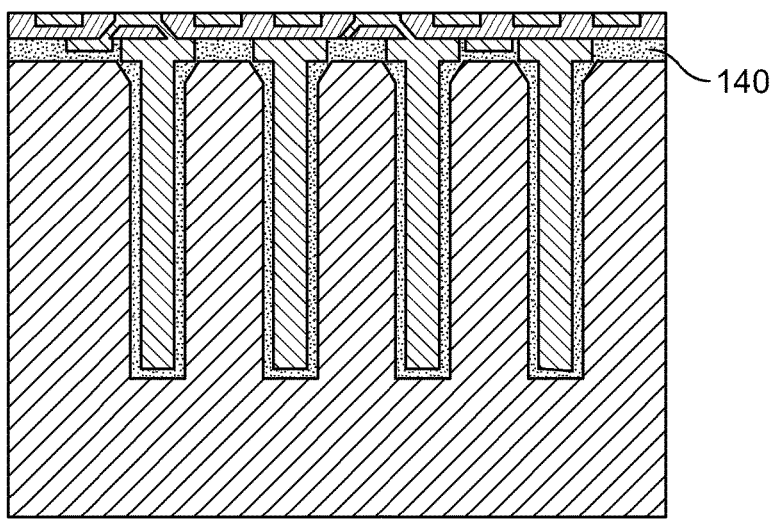
Figure 23:
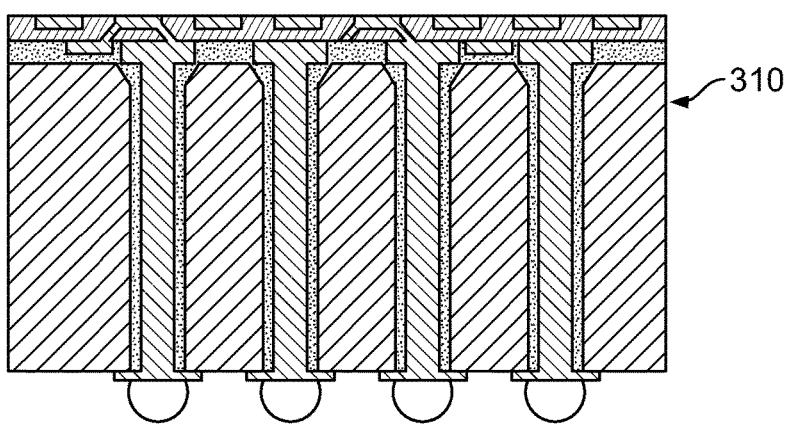
Figure 24:
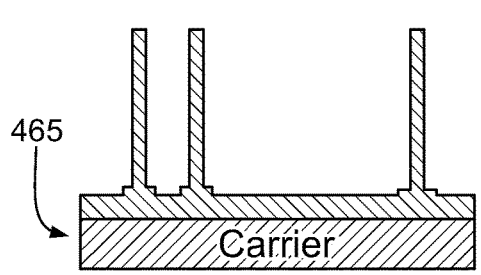
FIGS. 24, 25, 26, 27 and 28 are sectional views illustrating stages in a method of fabricating a microelectronic element in accordance with an embodiment of the invention.

FIGS. 21-23 illustrate another variation of the above-described process. As seen in FIG. 21, an in-process element 159 having wire bonds 32 extending therefrom is juxtaposed with low CTE element 119 such that a gap exists between the two which can accommodate flow of a dielectric material in fluid form for the purpose of filling each opening 138. Thereafter, as seen in FIG. 22, a dielectric material 140 can be flowed into each opening. As further seen in FIG. 23, the low CTE element then can be thinned and contacts and conductive masses, e.g., solder masses added thereto to form a component 310 such as an interposer. Examples of the dielectric fill material can be inorganic or polymeric material as described above. In some cases, the flow may be in gaseous form, such as for deposition of a dielectric coating within openings such as parylene, among others. Processing in accordance with the variation seen in FIGS. 21-23 to form the dielectric fill layer can be performed in any or all of the above-described embodiments.

Figure 26:
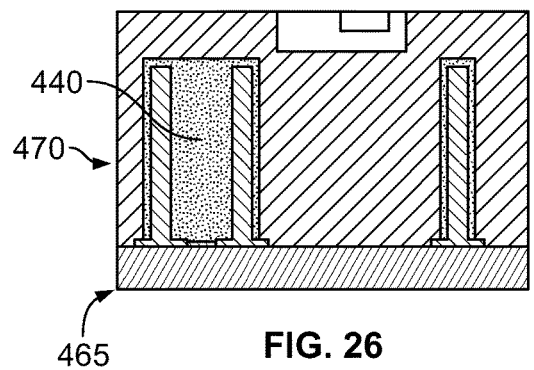
Figure 27:
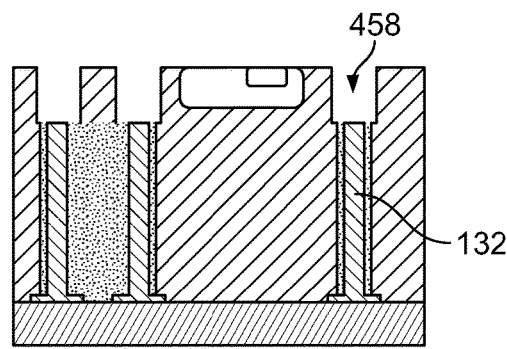
Figure 28:
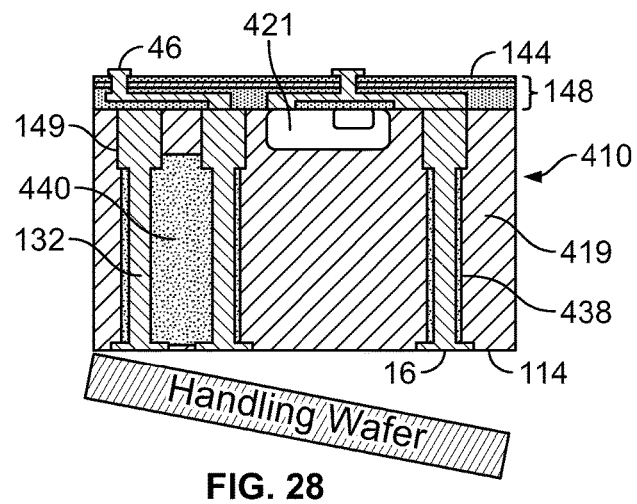

A further variation of the above-described process is illustrated in FIGS. 24-28 in which the resulting component 410 (FIG. 28) is a microelectronic element, which may comprise a semiconductor chip through which wire bonds 132 extend in a direction of a thickness thereof for purposes of providing electrical interconnects between contacts 46 provided at a first surface 144 of the component 410 and contacts 16 provided at a second surface 114 of the component opposite from the first surface. As seen in FIG. 28, the microelectronic element may include a semiconductor region 419 through which wire bonds 132 extend, the semiconductor region typically formed of monocrystalline semiconductor material, but which may have a different crystalline structure in an appropriate case. A plurality of active devices 421 are disposed at least partially in the semiconductor region 419, which may be transistors, diodes, or any of a variety of active devices which may comprise and utilize semiconductor regions as part of their functional structure. As further seen in FIG. 28, a horizontal and vertical interconnect structure 148 which may include multiple interconnect layers such as a back end of the line ("BEOL") wiring structure or a redistribution structure, the interconnect structure being formed atop the semiconductor region 419. Electrically conductive, e.g., metallic connectors 149 can electrically couple the wire bonds 132 and the interconnect structure 148 of the component 410, and may be disposed between the wire bonds and interconnect structure. As in the above-described embodiments and variations thereof, a dielectric fill material 440 can be disposed within the openings 438 surrounding each wire bond. Alternatively, the dielectric fill material can be omitted, or the dielectric material may only plug the top or bottom ends or both ends of the openings 438. In some cases, the openings 438 may only be lined with a dielectric material as described above but not filled.

Figure 25:
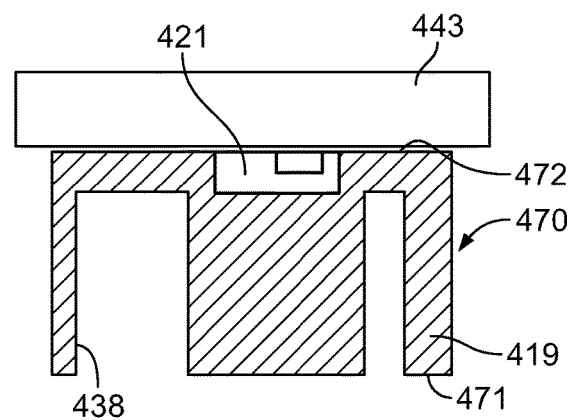

A process of fabricating a component such as seen in FIG. 28 can comprise uniting an in-process element 465 (FIG. 24) with a microelectronic element 470 (FIG. 25) having a plurality of active devices already formed therein. The process may be considered a "via middle" process because vertical interconnects formed by the wire bonds 132 are formed after high temperature fabrication of the active devices in the semiconductor region is completed, but before the interconnect structure 148 (FIG. 28) has been formed. As seen in FIG. 25, a set of openings 438 have been formed extending from a back surface 471 of the microelectronic element 470 towards a front surface 472 thereof at which active devices 421 can be disposed, the openings each sized to accommodate either a single wire bond or a plurality of wire bonds and the spacing between adjacent wire bonds. The openings can be formed by any number of techniques which may involve mechanical, chemical or optical (e.g., laser ablation), techniques, among others. Thus, the openings 438 extend partially through a thickness of the semiconductor region 419. A carrier 443 may be attached to a front surface 472 of the semiconductor region while the openings are being formed.

FIG. 26 illustrates a subsequent stage of fabrication in which the in-process element 465 is united with the microelectronic element 470 and an optional dielectric fill material 440 may be provided within the openings. The carrier may also be removed.

As further shown in FIG. 27, front surface openings 458 can then be formed extending from the front surface of the microelectronic element in alignment with the wire bonds 132. A dielectric liner can then be formed within the front surface openings, after which an electrically conductive material can then be deposited into the openings to form metallic connectors 149 as seen in FIG. 28. In some examples, metallic connectors may be formed by various vapor deposition or plating processes, or combination thereof.

In each of the embodiments seen above, component may include wire bonds of substantial length in which the cylindrical shaft portion thereof may extend for tens to hundreds of microns. In particular example, the shaft of each wire bond may have a length from 50 microns to one millimeter.

In certain examples, microelectronic elements 410 fabricated in accordance with an embodiment of the invention can be stacked atop one another in a die stack, wherein the wire bonds 132 and connectors 149 and the interconnect structure 148 can function as through silicon vias ("TSVs"). In one example, a surface 114 of a microelectronic element 410 fabricated in this way may occupy the same area as the surface of the original semiconductor chip and have peripheral edges bounding that area which correspond to the edges of the original semiconductor chip from which it is made. In such example, the component 410 or processed microelectronic element can be referred to as a "chip-scale package" or "CSP".

In a variation of any or all of the embodiments described above relative to FIGS. 3 through 28, instead of forming the wire bonds 32 on a metal sheet 42, the wire bonds could be formed atop a circuit panel or a microelectronic element such as a semiconductor chip. In a particular embodiment, instead of removing the underlying structure supporting the wire bonds, e.g., metal sheet 42, circuit panel or semiconductor chip, the circuit panel or semiconductor chip can be allowed to remain in a microelectronic assembly which includes the interposer element and the underlying circuit panel or semiconductor chip.

In a variation of any or all of the embodiments described above relative to FIGS. 3 through 28, one or more additional components which may be active components, passive components, or combination thereof, can be pre-mounted on the underlying structure, e.g., a metal sheet, microelectronic element, or circuit panel, and such additional component(s) can then become embedded within the dielectric fill inside the opening in the completed component or interposer. In a variation of the embodiment described above, the openings in the low CTE element may extend through the entire thickness of the low CTE element before the wire bonds are inserted therein, such that there is no material of the low CTE element overlying the wire bonds in an axial direction of the wire bonds. In such case, thinning of the low CTE element described above to expose the openings 38 from the top of the low CTE element (such as thinning of the element 19 shown in FIG. 9) can be omitted.

It is to be understood that features shown and discussed with respect to one aspect, embodiment, arrangement or configuration of the invention may be used in conjunction with any other aspect, embodiment, arrangement or configuration of the invention. For example, although certain figures and their corresponding descriptions illustrate vertically extending wire bonds, it is to be understood that the wire bonds such as shown in other figures which extend in other than vertical directions may also be used in accordance with any embodiment shown or described.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements and combinations of the embodiments provided herein are contemplated by the present application. Further enhancements may be devised without departing from the spirit and scope of the present invention as defined in the embodiments described herein.

The invention claimed is:

1. A component, comprising:
 a plurality of wire bonds each extending in an axial direction within an opening of one or more openings in an element having a coefficient of thermal expansion ("CTE") of less than 10 parts per million per degree Celsius ("ppm/° C.") and each wire bond spaced at least partially away from a wall of the opening within which it extends;
 first contacts at a first surface of the component and second contacts at a second surface of the component facing in a direction opposite from the first surface, the first contacts being first ends of the wire bonds or the first contacts being coupled to first ends of the wire bonds, and the second contacts electrically coupled with the wire bonds,
 wherein the first contacts and the second contacts are within an axial distance of less than 50 microns from the wire bonds.

2. The component of claim 1, wherein at least one of the first contacts or the second contacts are electrically coupled with the wire bonds through a redistribution layer overlying the wire bonds and overlying a surface of the element defining a plane transverse to the axial direction of the openings.

3. The component of claim 1, wherein individual wire bonds of the plurality of wire bonds are disposed within respective openings in the element, such that each wire bond is separated from each other wire bond by material of the element.

4. The component of claim 1, wherein some of the plurality of the wire bonds are disposed within a same opening of the plurality of openings.

5. The component of claim 1, further comprising an electrically insulative material within the openings in contact with the wire bonds.

6. The component of claim 1, wherein the element includes a plurality of active devices, wherein the first and second contacts are electrically coupled with one another and with at least some of the plurality of active devices.

7. The component of claim 6, wherein the element includes a monocrystalline semiconductor region, at least some of the active devices being disposed at least partially within the monocrystalline semiconductor region, and the openings extending at least partially through the monocrystalline semiconductor region.

8. The component of claim 6, in which wire bonds extend only partially through a thickness of the element, further comprising electrically conductive connectors extending in an axial direction from the wire bonds at least partially through a remaining portion of the thickness of the element, the connectors formed of deposited electrically conductive material.

* * * * *